(12) United States Patent
Peterson et al.

(10) Patent No.: US 8,095,859 B1
(45) Date of Patent: Jan. 10, 2012

(54) ENCODER FOR LOW-DENSITY PARITY CHECK CODES

(75) Inventors: Justin C. Peterson, Stansbury Park, UT (US); Steven O. Hadfield, Kaysville, UT (US); Ryan Hinton, Crozet, VA (US)

(73) Assignee: L-3 Communications, Corp., New York, NY (US)

( * ) Notice: Subject to any disclaimer, the term of this patent is extended or adjusted under 35 U.S.C. 154(b) by 1037 days.

(21) Appl. No.: 11/971,875

(22) Filed: Jan. 9, 2008

(51) Int. Cl.
*G06F 11/00* (2006.01)

(52) U.S. Cl. ........................ 714/801; 714/804

(58) Field of Classification Search ............... 375/240; 714/779, 752, 780, 800, 801, 804
See application file for complete search history.

(56) References Cited

U.S. PATENT DOCUMENTS

| | | | |
|---|---|---|---|
| 6,539,367 B1 | 3/2003 | Blanksby et al. | |
| 7,139,959 B2 | 11/2006 | Hocevar | |
| 7,162,684 B2 | 1/2007 | Hocevar | |
| 7,178,080 B2 | 2/2007 | Hocevar | |
| 7,346,832 B2 * | 3/2008 | Richardson et al. | 714/779 |
| 7,499,490 B2 * | 3/2009 | Divsalar et al. | 375/240 |
| 7,543,212 B2 * | 6/2009 | Miles et al. | 714/752 |
| 7,669,109 B2 * | 2/2010 | Hocevar | 714/780 |
| 7,831,895 B2 * | 11/2010 | Lin | 714/800 |
| 2006/0291571 A1 | 12/2006 | Divsalar et al. | |
| 2007/0033485 A1 * | 2/2007 | Cohen et al. | 714/758 |

OTHER PUBLICATIONS

Zhang, Juntan et al. "Shuffled Iterative Decoding", IEEE, Feb. 2005, pp. 209-213, vol. 53, No. 2.

Karkooti, Marjan, Semi-Parallel; Architectures for Real-Time LDPC Coding, May 2004, pp. 1-87, Houston, Texas.
Leiner, Bernhard, "LDPC Codes—a brief Tutorial," Apr. 8, 2005, pp. 1-9.
Tanner, R. Michael, "LDPC Block and Convolutional Codes Based on Circulant Matrices," IEEE, Dec. 2004, pp. 2966-2984, vol. 50, No. 12.
Mansour, Mohammad M. et al., "High-Throughput LDPC Decoders," IEEE, Dec. 2003, pp. 976-996, vol. 11, No. 6.
Gallager, Robert G., "Low-Density Parity-Check Codes," 1963, pp. 1-90.
Blanksby, Andrew et al., "A 690- mW 1-Gb/s 1024-b, Rate- 1/2 Low-Density Parity-Check Code Decoder," IEEE, Mar. 2002, pp. 404-412, vol. 37, No. 3.
Prabhakar, A et al. "Memory Efficient Scalable Decoder Architectures for Low Density Parity Check Codes," WCL Technical Report, May 12, 2006, pp. 1-41.
Sun, Jian, "An Introduction to Low Density Parity Check (LDPC) Codes," Wireless Communication Research Laboratory Lane Dept. of Comp. Sci. and Elec. Engr. pp. 1-22, West Virginia University, Dated: 2003.

* cited by examiner

*Primary Examiner* — David Ton
(74) *Attorney, Agent, or Firm* — Kirton & McConkie; N. Kenneth Burraston

(57) ABSTRACT

Encoding of a low-density parity check code uses a block-circulant encoding matrix built from circulant matrices. Encoding can include partitioning data into a plurality of data segments. The data segments are each circularly rotated. A plurality of XOR summations are formed for each rotation of the data segments to produce output symbols. The XOR summations use data from the data segments defined by the circulant matrices. Output symbols are produced in parallel for each rotation of the data segments.

18 Claims, 6 Drawing Sheets

ENCODER FOR LOW-DENSITY PARITY CHECK CODES

FIELD OF THE INVENTION

The present invention relates generally to the encoding of low-density parity check codes.

BACKGROUND

Low-density parity check (LDPC) codes are block codes that can provide highly efficient error correction coding (approaching the Shannon limit for large block sizes). LDPC codes introduce redundancy into the transmitted code word in such a way that the parity check matrix is sparse (i.e., has few 1's in each row and column). This enables efficient decoding algorithms.

Encoding of an LDPC code can be performed by multiplying a message word by a generator matrix for the code. Although the parity matrix is sparse, however, the generator matrix is not necessarily sparse. Accordingly, the matrix multiplication can use a large amount of processing. Even when a generator matrix is sparse, straightforward matrix multiplication can be inefficient.

One approach to avoid the high computation cost of direct matrix multiplication is the use of a decoder to perform encoding. In this approach, the information portion of the code word is initialized with transmission data, and the parity bits are initialized to indicate erasure. Decoding is then performed to determine the value of the parity bits. Unfortunately, this approach does not work for all codes.

Efficient code structures have been found for certain designs based on circulant matrices. For example, one approach uses recursive convolutional type encoders based on feedback shift registers. The shift registers are modified from that of a conventional convolutional encoder by providing tap multiplication based on the circulant pattern. The circulant pattern is stored in a shift register and rotated. Unfortunately, this encoder structure still uses a relatively large amount of hardware and is not easily amenable to parallel operation.

SUMMARY OF THE INVENTION

It has been recognized that it would be advantageous to develop improved approaches for encoding of low-density parity check codes.

One embodiment of the present invention is an encoder for a low-density parity check (LDPC) code. The LDPC code includes a block circulant encoding matrix built from circulant matrices. The encoder can include a plurality of shift registers, each of the shift registers having a load input to receive a data segment and a feedback connection to enable rotation of the data segment within the shift register. The encoder can also include a plurality of XOR gates coupled to the shift registers, the XOR gates having connections to the shift registers corresponding to the circulant matrices to produce a plurality of output symbols in parallel for each rotation of the data.

In another embodiment of the present invention, an encoder for low-density parity check codes includes a block circulant encoding matrix of size rT×sT, wherein T corresponds to a circulant matrix size. The encoder can include a means for storing a data input as s non-overlapping data segments, each of length T and a means for rotating each of the data segments. The encoder may also include means for forming a plurality of r XOR summations using data selections from the data segments corresponding to circulant matrices. Each rotation of the data segments can produce s output symbols in parallel.

Another embodiment of the present invention includes a method of encoding a data vector to produce output symbols for a low-density parity check code. The method can include partitioning a data vector into a plurality of non-overlapping data segments and loading the data segments into a plurality of corresponding shift registers. The method can also include rotating the data segments within the shift registers and forming a plurality of XOR summations for each rotation of the data segments to produce output symbols. A plurality of output symbols may be produced in parallel. The XOR summations use data from the shift registers corresponding to the circulant matrices.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

DETAILED DESCRIPTION

Figures 1, 2:
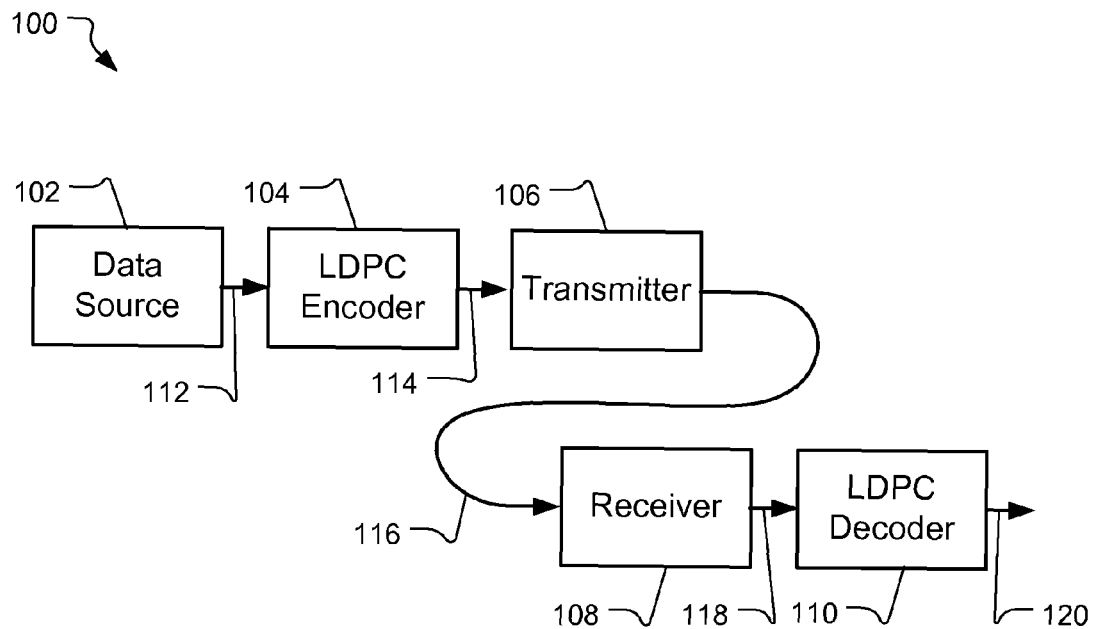
FIG. 1 is a block diagram of a communication system using an LDPC encoder in accordance with an embodiment of the present invention.
FIG. 2 is a block circulant matrix in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Within the document, the following conventions are used. Matrices are represented by upper case bold characters (e.g., A, B, H). Vector quantities are represented using lower case bold characters (e.g., c, u, p), while scalar quantities are represented using lower case italic characters (e.g., n, m, k). While discussion throughout this document is represented using column vectors, it will be appreciated that operation using row vectors can also be performed using appropriate transposition of matrices and ordering of multiplication.

FIG. 1 illustrates a block diagram of a communication system which includes low-density parity check (LDPC) encoding and decoding. The system, shown generally at 100, includes a data source 102, an LDPC encoder 104, a transmitter 106, a receiver 108, and a LDPC decoder 110. Source data 112 from the data source is accepted by the low-density parity check encoder and encoded to incorporate redundancy into the encoded data 114. For example, the encoder may produce two output data bits for each input data bit, three output bits for each input bit, four output bits for each three input bits, or other ratios of encoded data to source data as are known in the art. While binary data encoding is typically used, the techniques described herein are not limited to binary data, and higher order data encoding alphabets can also be used with appropriate modification of the modulus of arithmetic. Detailed operation of the encoder is described further below.

The encoded data 114 is transmitted as symbols encoded into a physical signal 116 by the transmitter 106. Various ways of encoding symbols into a physical signal are known, including for example, using amplitude modulation, frequency modulation, phase modulation, or combinations thereof. Particular examples include binary phase shift keying, quadrature phase shift keying, and quadrature amplitude modulation.

The physical signal 116 is communicated to the receiver 108. For example, the physical signal may pass through a wired or wireless communications channel. For example, wireless communications channels include radio communications channels, optical communications channels, and acoustic communications channels. As another example, the physical signal may be communicated via a memory medium (e.g., one or more disk drives), wherein transmission includes recording onto the memory medium and reception includes reading from the memory medium.

Reception of the physical signal 116 at the receiver 108 may be corrupted by noise, interference, and other error sources. For example, noise may be additive noise caused by thermal effects within the front end of the receiver, atmospheric effects, or other sources.

The receiver 108 provides channel likelihood values 118 to the LDPC decoder 110 for decoding. The channel likelihood values represent likelihoods of the received data. The LDPC decoder performs iterative decoding to attempt to recover the source data.

For example, an LDPC code of length n having m check nodes can be represented by an m row by n column parity check matrix $H=[h_{ij}]_{m \times n}$. Data vector u (having k data symbols organized in a column vector) can be encoded to produce a code word c having n symbols. Generally, n>k, as the code adds redundancy to aid in error detection and correction in the decoding process. For example, encoding may be performed by multiplying data vector u by generator matrix G to form the code word c=Gu. The generator matrix is n rows by k columns.

A code word c when multiplied by the parity check matrix H produces a zero vector, 0=Hc. The received data r, however, may not be a code word if errors have occurred during transmission; that is Hr≠0. In such a case, one or more symbols (or bits) of the received data are incorrect. The decoder iterates, attempting to correct errors and determine the correct received data r corresponding to what was transmitted, such that Hr̂=0. Various types of LDPC decoding can be used, including for example, belief propagation techniques. As another example, the LDPC decoder can be as described in commonly-owned co-pending U.S. patent application Ser. No. 11/971,876, entitled "Low-Density Parity Check Decoding Using Combined Check Node and Variable Node,", filed the same day as the present application, and herein incorporated by reference.

Decoded data 120 can be output from the decoder 110. For example, decoded data may be passed on to other electronic equipment for further use in the form of an electronic signal (e.g., a digital logic signal) for additional processing, or the decoded data may be stored in a memory for later use (e.g., in a digital or numeric form). As another example, the decoded data may be printed or displayed for a user.

Turning to the encoder in detail, encoding may be performed using the parity check matrix H, or using the generator matrix G. For example, when the code is defined by the generator matrix G, encoding corresponds to performing the multiplication c=Gu.

In a systematic code, the encoding operation can be represented by:

$$c = Gu = \begin{bmatrix} I \\ A \end{bmatrix} u = \begin{bmatrix} u \\ Au \end{bmatrix} = \begin{bmatrix} u \\ p \end{bmatrix}$$

where I is a k by k identity matrix, A is a k column by m row "encoding" matrix, and p is a column vector of parity symbols. For simplicity, it is treated herein as though the number of rows in the parity check matrix m is equal to the number of parity symbols. It will be appreciated, however, that the parity check matrix may include additional (linearly dependent rows), in which case the same basic approaches described herein can be readily applied. Since the systematic code appends m=n−k parity symbols to the data vector, encoding can be performed by performing the matrix multiplication p=Au to obtain the parity symbols, and then transmitting the data u and parity symbols p. It will be appreciated that simple column or row rearrangements in the parity check or generator matrix results in an equivalent code having the same error correcting properties as the original code. Accordingly, systematic codes can be represented in the above form by reordering the data and parity symbols, if necessary, to produce the above form without changing the strength of the code.

As noted above, however, matrix multiplication can be inefficient. Accordingly, in one embodiment of the present invention, an encoder can take advantage of the repeat nature of circulant matrices when the encoding matrix (the A matrix) is defined based on circulant matrices.

In general, a block circulant matrix can be constructed using a base matrix which is expanded by circulant matrices of width T. For example, a base matrix of size r rows by s columns can be expanded using circulant matrices of size T to produce a Tr rows by Ts columns block circulant matrix. A circulant matrix is a square matrix where each row is constructed from the above row by a single cyclic shift. For example, an identity matrix is a circulant matrix, wherein each row has a single entry of '1' along the diagonal (extending from upper left to lower right) and all other entries are '0'. More generally, circulant matrices may have multiple '1's in each row.

For example, FIG. 2 provides an illustration of a block circulant matrix formed from a base matrix of size r=2, s=2, which has been expanded to form a matrix of size 10×10 using circulant matrices of width T=5. The upper left and lower right entries of the block circulant matrix uses rotated identity matrices having a single '1' in each row. The upper right and lower left entries of the block circulant matrix use circulant matrices having two '1's in each row.

For encoding using a block circulant encoding matrix, the process to be performed is the matrix multiplication of an input data vector u by a matrix A (e.g., as shown in FIG. 2) to produce the vector a=Au. The a vector can be transmitted as parity symbols p. (Other applications for using a block circulant encoding matrix are discussed further below).

FIG. 2 has been labeled to show the correspondence of data elements $u_0 \ldots u_9$ to the columns and correspondence of output symbol elements $a_0 \ldots a_9$ to the rows. While this encoding can be performed by a direct matrix multiplication, it will be appreciated that such an approach can be inefficient. In particular, many matrix entries are zero in a sparse matrix.

In contrast, an encoder in accordance with an embodiment of the present invention can take advantage of the circulant nature of the sub-matrices to provide an efficient implementation. Examining FIG. 2 in detail, it can be seen that for each row of the 2×2 base matrix, there are 5 rows of the block circulant matrix, differing from each other only by a circular shift of one in each sub-matrix portion of the row. Accordingly, the input data can be stored in segments corresponding to the sub-matrix portions. The segments can be connected to exclusive-or (XOR) gates with connections corresponding to where there are '1's in the circulant matrices in the first rows of the circulant matrices. The data can be rotated past the connections to form the required XOR computations, effectively performing the matrix multiplication in a highly efficient manner.

Figure 3:
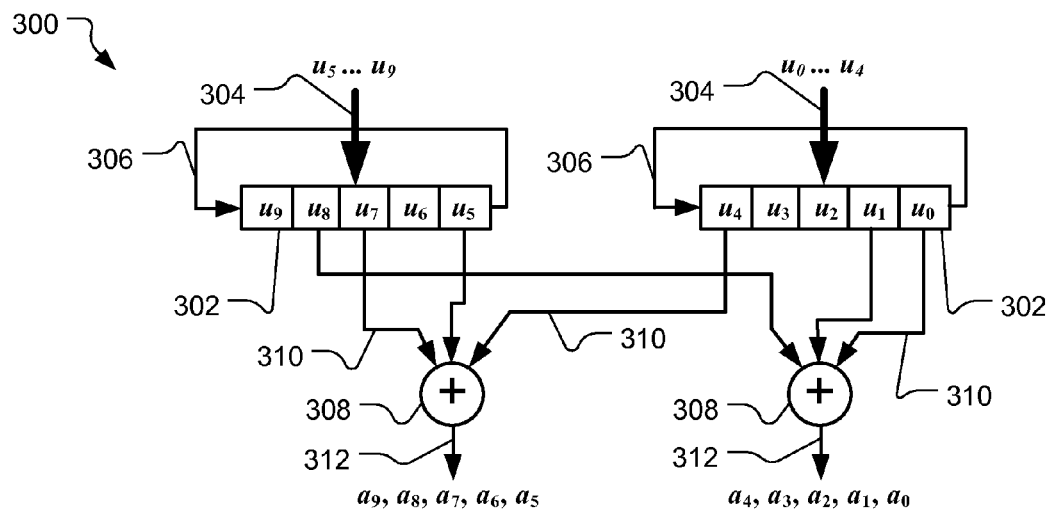
FIG. 3 is a detailed block diagram of an LDPC encoder in accordance with an embodiment of the present invention.

FIG. 3 illustrates an encoder for encoding with the block circulant matrix of FIG. 2 in accordance with an embodiment of the present invention. The encoder 300 includes a plurality of shift registers 302. The shift registers can include a load input 304 for storing the data to be encoded. For example, as illustrated here, the load input can be a parallel input, although serial data input can be provided as explained below in reference to FIG. 4. A feedback connection 306 enables rotation of the data within the shift registers.

A plurality of XOR gates 308 are connected to the shift registers 302 with connections 310 corresponding to the first rows of the circulant matrices. The XOR gates form exclusive-or summations to produce output symbols 312. The output symbols may be transmitted as parity symbols.

Each rotation of the data segments within the shift registers 306 corresponds to a row of the block circulant matrix. For example, shown within the shift registers are data labels corresponding to information bits $u_0 \ldots u_9$ when the data is initially loaded into the shift registers. Accordingly, the first outputs from the encoder 300 are $a_0$ and $a_5$. The contents of the shift registers are shifted on a per-segment basis. Accordingly, it can be seen that the contents of the shift registers are properly lined up with the taps to the XOR functions to calculate the next row of the block circulant matrix, producing outputs $a_1$ and $a_6$. Rotation is repeated, until all of the rows have been calculated.

Each shift of the shift register corresponds to the next row of the block circulant matrix, and the XOR functions compute one output for each shift. Thus, two output symbols are computed in parallel for each shift (rotation) of the shift registers. After five shifts, all of the terms of the matrix multiplication have been computed. If one shift is performed for each clock cycle, the encoder can perform the matrix multiplication of the input information by the A matrix in five clock cycles.

Figure 4:
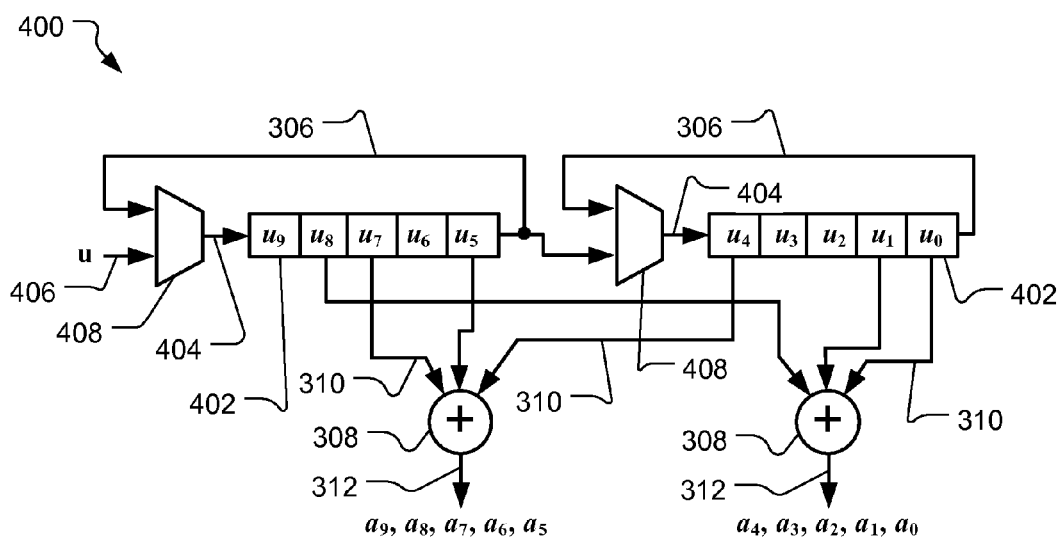
FIG. 4 is a detailed block diagram of an alternate arrangement of an LDPC encoder in accordance with an embodiment of the present invention.

FIG. 4 illustrates an alternate arrangement of an encoder in accordance with an embodiment of the present invention. The encoder is similar to that of FIG. 3, except that shift registers 402 having a single serial input 404 are used. Thus, data is loaded into the shift registers serial via data input 406. Multiplexers 408 are used to switch the serial input 404 between the data input and feedback 306.

Other arrangements of the shift register input may also be used. For example, data may input in a combined parallel-serial format. In a parallel-serial format, data may be loaded serially into shift registers, and multiple data bits loaded on each clock into different shift registers. As a particular example, a separate data input may be provided to each shift register, and data loaded using T clocks.

While the block circulant matrices illustrated above is square, the invention is not limited to the use of square matrices. In general, the block circulant matrix may have dimensions of Tr row by Ts columns, where the base matrix has size r row by s columns, and the circulant matrices have size T rows by T columns. In such a case, it will be appreciated that an input data vector of length k is partitioned into k/s segments of length T each (k=Ts). An encoder can accordingly include a means for storing input data to be encoded as s non-overlapping data segments, each of length T. For example, the means for storing the input data can be providing by shift registers or memories.

Figure 5:
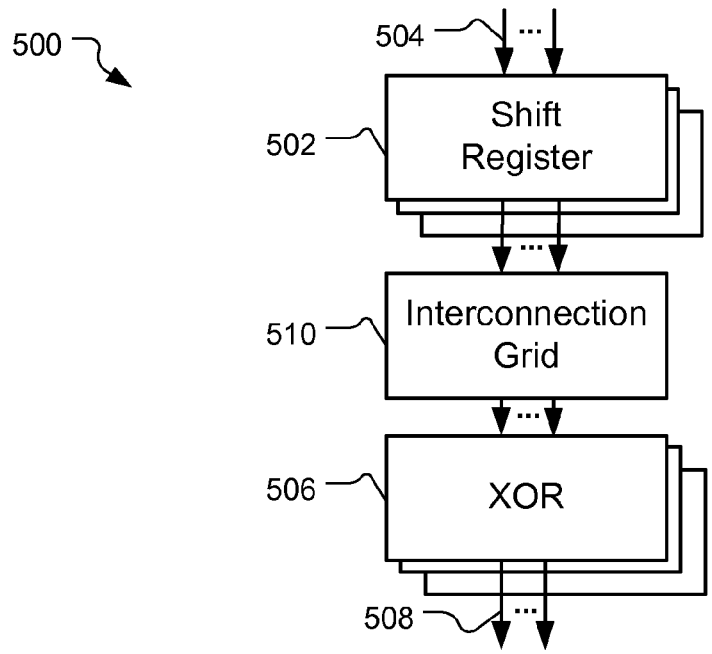
FIG. 5 is a block diagram of another arrangement of an LDPC encoder in accordance with an embodiment of the present invention.

FIG. 5 illustrates an encoder for a block circulant matrix of size Tr rows by Ts columns in accordance with an embodiment of the present invention. The encoder 500 includes a plurality of means for storing the input data. For example, the means for storing the input data can be a plurality of s shift registers 502 accepting the input data 504.

The means for storing the input data can include means for rotating the data segments. For example, the shift registers 502 can include feedback connections as described above. As another example, a memory register can provide a means for storing the input data and can simulate a circularly shifted shift register. As yet another example, a lookup table can be used to simulate a circular shift. As yet another example, individual latches or flip flops can be combined to form a shift register having load and circular rotation capability. It will be appreciated that logic functions, such as a shift register, may be designed schematically or may be designed using a hardware description language (e.g., Verilog or VHDL).

The encoder 500 can also include means for forming a plurality of XOR summations using data selections from the data segments corresponding to the circulant matrices. For example, the encoder can also include r XOR gates 506 to produce r output symbols 508 in parallel each clock cycle. In general, a total of T clock cycles are used, with r outputs being produced each clock cycle.

An interconnection grid 510 connects tap connections from the shift registers 502 to the XOR gates 506 as determined by the circulant matrices. For example, the connections may correspond to the first rows of the circulant matrices, when data is loaded in a forward order. As another example, the connections may correspond to the last rows of the circulant matrices, when data is loaded in a reverse order, and calculations may occur in a reverse order. Various other arrangements in the order of calculations can be used.

The interconnection grid 510 may be provided by hard-wired connections (e.g., physical wires or interconnect traces within a printed circuit card or integrated circuit), a cross-bar switch, programmable connections (e.g., within a field programmable gate array), mask programmed connections, or the like.

The encoder 500 can also include means for outputting the output symbols. For example, the means for outputting may be provided by drivers that produce physical output signals within an integrated circuit, electronic circuit board, processor, or the like. As another example, output symbols may be output by storing the output symbols into a memory, for example, for further processing. The output symbols and the input data may be provided to a transmitter, for example, in a communication system.

Various size matrices may be used in embodiments of the present invention. Generally, code sizes of $1,000 \leq n \leq 100,000$ are useful, although other sizes can be used in embodiments of the present invention. Various ranges for the circulant size T and base matrix size r and s can be used. Generally, $r \geq 2$, $s \geq 2$, and $T \geq 2$.

While the discussion above has primarily described encoding using a systematic generator matrix, non-systematic generator matrices can be handled in a similar manner according to embodiments of the present invention. For example, a non-systematic generator matrix may be provided in a block circulant form. In such a case, the matrix multiplication uses the full G matrix as the encoding matrix, rather than the subset A-matrix as described above. The input data of length k is thus divided into s=k/T segments and r=n/T output symbols are produced in parallel each clock. The output vector a is therefore the code word that can be transmitted. Alternately, a non-systematic generator matrix of full rank may be transformed into a systematic generator matrix while providing a code with identical error correcting capability.

In summary, for encoding of an (n,k) LDPC code using a systematic generator matrix, a block circulant sub-matrix A of size k=sT columns by m=rT rows is used as the encoding matrix, and r output symbols are produced in parallel. The code word is the data and the output symbols, with ordering as defined by the particular LDPC code. The code word can be transmitted.

For encoding of an (n,k) LDPC code using a non-systematic block-circulant generator matrix, the encoding matrix is the generator matrix of size k=sT columns by n=r'T rows. For this case, r' output symbols are produced in parallel. The output symbols are transmitted as the code word.

As noted above, encoding may also be performed using a parity check matrix. When a parity check matrix is used, additional processing steps may be performed on the output symbols to form parity symbols for transmission. For example, considering first a systematic code, the parity check matrix can be partitioned into H=[A B], and the code word partitioned into data u and parity p, so that the parity check equation is given by $$0 = Hc = [AB]\begin{bmatrix} u \\ p \end{bmatrix} = Au + Bp$$

Figure 6:
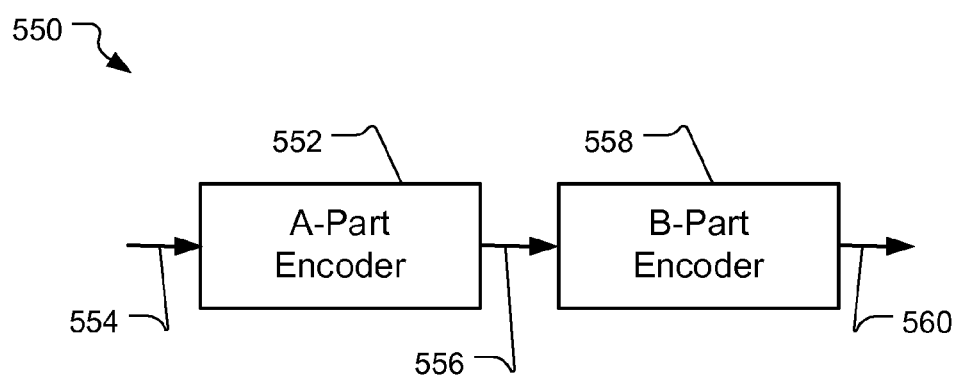
FIG. 6 is a block diagram of an LDPC encoder having an A-part encoder and a B-part encoder in accordance with another embodiment of the present invention.

For encoding, we know the data u and wish to find the parity p, and thus this equation can be reduced to the form Au=Bp The A matrix has dimensions of n-k rows by k columns, so the result a=Au is a vector of length n-k (or in typical cases, m). The B matrix is a square matrix with dimensions of n-k by n-k, or in typical cases m by m. As described above, multiplication of the data by the A matrix can be performed in such a way as to take advantage of the block circulant nature of the A matrix. The additional processing takes into account the B matrix. For example, FIG. 6 provides a high level block diagram for an LDPC encoder 550 using a parity check matrix. The encoder includes an A-part encoder 552 which accepts the input data 554, and performs a matrix multiplication of the input data by the encoding matrix (A-matrix) to produce output symbols 556. For example, the A-part encoder part can be an encoder as described in FIG. 3, FIG. 4, or FIG. 5 above. The output symbols 556 are a passed to a B-part encoder 558. The B-part encoder performs the additional processing to account for the B matrix and produces output parity 560.

For certain parity check matrix structures, the B-part encoder 558 can be efficiently implemented. For example, the B matrix may be in lower triangular form. A lower triangular matrix has all entries zero above the top, right-most full diagonal. For a lower triangular matrix, the additional processing can be implemented in a recursive form, calculating each parity symbol from a combination of previous parity symbols and previous data. For the particular case where the B matrix consists of a diagonal and subdiagonal (e.g., as illustrated in FIG. 7), the additional processing is an accumulator as described more fully below with reference to FIG. 8.

Various ways of arranging the parity check matrix to form the A matrix and B matrix can be used. For example, the parity check matrix for the code may be constructed by generating a block circulant A matrix and appending a B matrix in lower triangular form. Various ways of forming the A matrix can be used. For example, connections within a base matrix may be made randomly or following an algorithm such as "progressive edge growth." In general, the A matrix may have a degree distribution that has a large number of degree-2 variable nodes.

In accordance with another embodiment, a block circulant B matrix may be formed, and then rearranged into lower triangular form by eliminating a single '1' entry from the matrix. As described above, a block circulant parity matrix may be formed by starting from a base matrix (e.g., of size r×s) and expanding by circulant matrices of size T to form the parity check matrix. The matrix may have columns and rows reordered without affecting the error correcting capability of the code. The resulting block circulant matrix is not perfectly clock circulant, and thus a minor adjustment in decoder operation may be used to account for the missing '1'.

Figure 7:
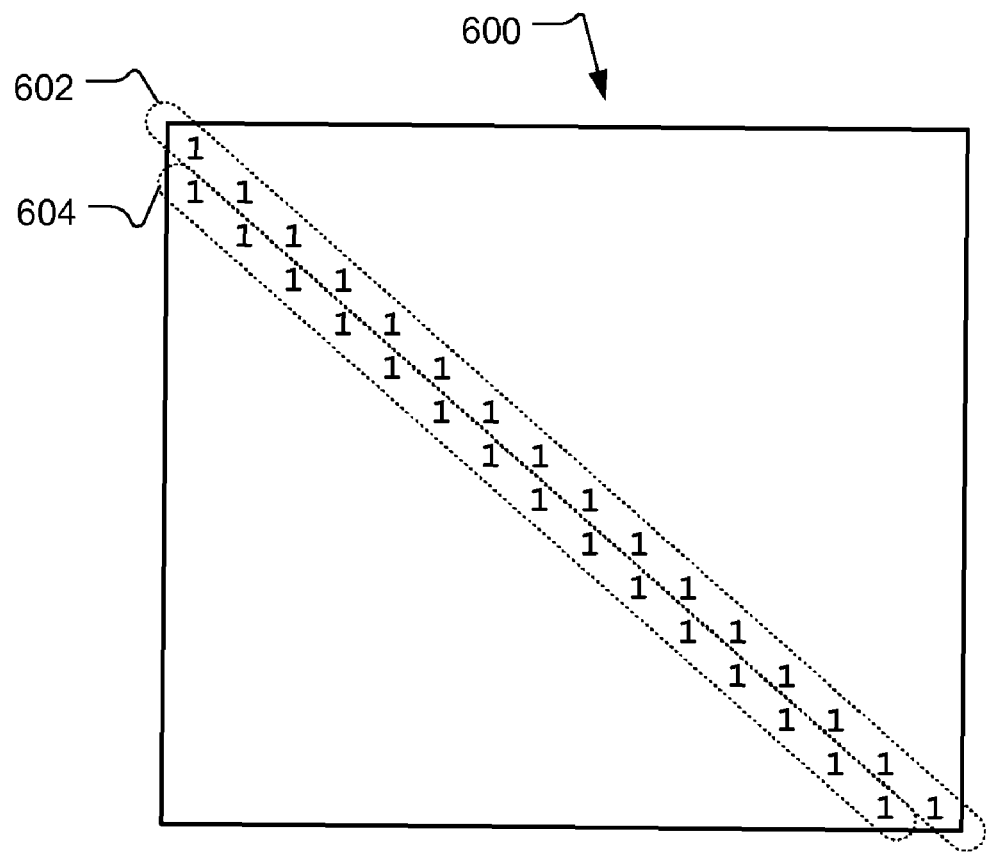
FIG. 7 is a B-part sub-matrix of a parity check matrix in accordance with an embodiment of the present invention.

An exemplary B matrix 600 is illustrated in FIG. 7 having an accumulator structure. The B matrix includes a diagonal 602 and sub-diagonal 604 which are all ones; remaining elements are all zero. Finding the parity corresponds to solving the equation Au=Bp, which, using a=Au, can be written out in scalar form as:

$$a_0 = p_0$$
$$a_1 = p_0 + p_1$$
$$a_2 = p_2 + p_1$$
$$\vdots$$
$$a_n = p_n + p_{n-1}$$

or solved to yield the recursive set of equations:

$$p_0 = a_0$$
$$p_1 = p_0 + a_1$$
$$p_2 = p_1 + a_2$$
$$\vdots$$
$$p_n = p_{n-1} + a_n$$

Accordingly, a B-part encoder can be a recursive accumulator structure to compute the output parity from the output symbols from an A-part encoder according to the relationships defined by the B sub-matrix of the parity check matrix.

Figure 8:
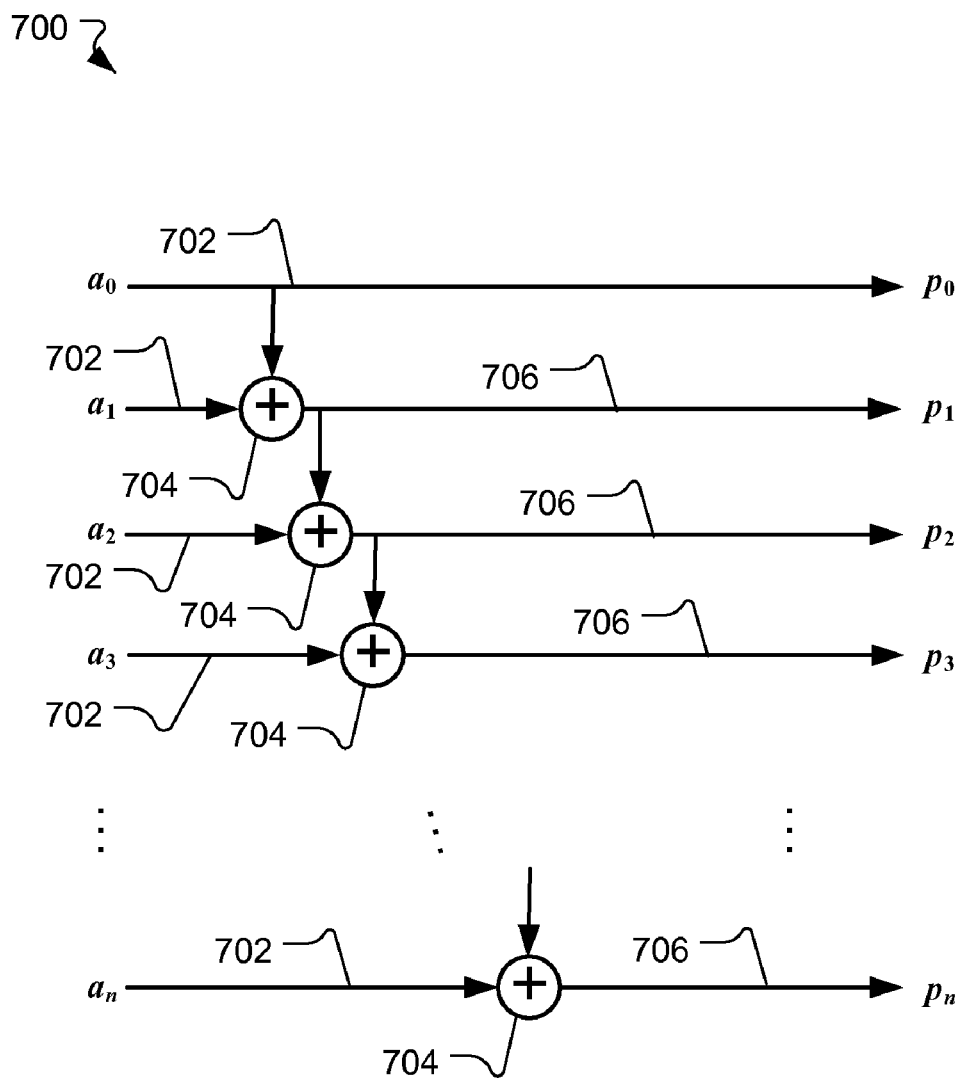
FIG. 8 is a detailed block diagram of a B-part encoder in accordance with an embodiment of the present invention.

For example, the B-part encoder can include means for recursively summing the plurality of output symbols (from the A-part encoder) to form a plurality of parity symbols. One exemplary embodiment of a B-part encoder is illustrated in FIG. 8. The B-part encoder 700 accepts a plurality of output symbols 702 from an A-part encoder. The output symbols are applied to a plurality of XOR summers 704 which form a plurality of parity symbols 706 corresponding to the equations above. While not shown in FIG. 8, pipeline registers may be included to provide for increased throughput and parallelism if desired.

Alternately, the B matrix need not be in an accumulator form. In general, when the B matrix is lower triangular, each parity symbol can be calculated from a combination of output symbols (from the A-part encoder) and previously calculated parity symbols.

A non-systematic parity check matrix can also be accommodated, although this involves additional processing in a receiver to recover the decoded data. In such a case, the code word will contain k symbols corresponding to the message. This portion of the code word can be identified as u'. It will be appreciated that u' is a linear combination of the message bits, so u'=Fu, where F is a full-rank square k by k matrix. F is full rank, otherwise some message symbols would be lost by the code. If F is an identity matrix, this situation is simply a systematic code, which can be encoded as described above. If F is a permutation matrix, then the code is also systematic, with reordering of the data, and encoding can be performed as described above. In F is block circulant, with the same block circulant size as the parity check matrix, the matrix A'=FA can be formed and used in the A-part encoding, as A' will also be block circulant. Alternately, the A-part encoding can use the u' vector, and form a=Au' as described above.

An LDPC encoder in accordance with embodiments of the present invention can be implemented in various ways. For example, the encoder may be implemented entirely or in part in a field programmable gate array (FPGA) or an application specific integrated circuit (ASIC). Elements of the encoder may be implemented in logic gates, combinatorial logic, lookup tables, configurable logic blocks, mask programming, and the like.

It will also be appreciated that the encoder may be implemented partially or entirely in software. Software may be tangibly embodied in the form of computer readable instructions stored in a machine-readable storage device for execution by a programmable processor. The programmable processor may execute the computer readable instructions to implement an encoding method, accepting input data as described above and generating output symbols or parity symbols as described above. One or more programmable processors may be used, and portions of the processing allocated to the processors according to a pre-defined schedule, on an as-available basis, or using other scheduling algorithms.

The software may be implemented in a high-level procedural or object-oriented programming language, in assembly language, machine language, or other form, and translated into machine executable instructions for execution. Translation into machine-readable instructions may be via a compiler, interpreter, or the like, and may occur before, during, or in part before and in part during execution of the machine-readable instructions.

Suitable processors include, by way of example, both general and special purpose microprocessors. Generally, a processor will receive instructions and data from a read-only memory and/or a random access memory. Processors may also include on-chip cache memory from which instructions are stored and accessed. Generally, a computer includes one or more mass storage devices for storing data files. Mass storage devices include, for example, magnetic disks, such as internal hard disks and removable disks; magneto-optical disks; and optical disks. Storage devices suitable for tangibly embodying computer program instructions and data include various forms of non-volatile memory, including by way of example, semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and/or FPGAs (field-programmable gate arrays).

Figure 9:
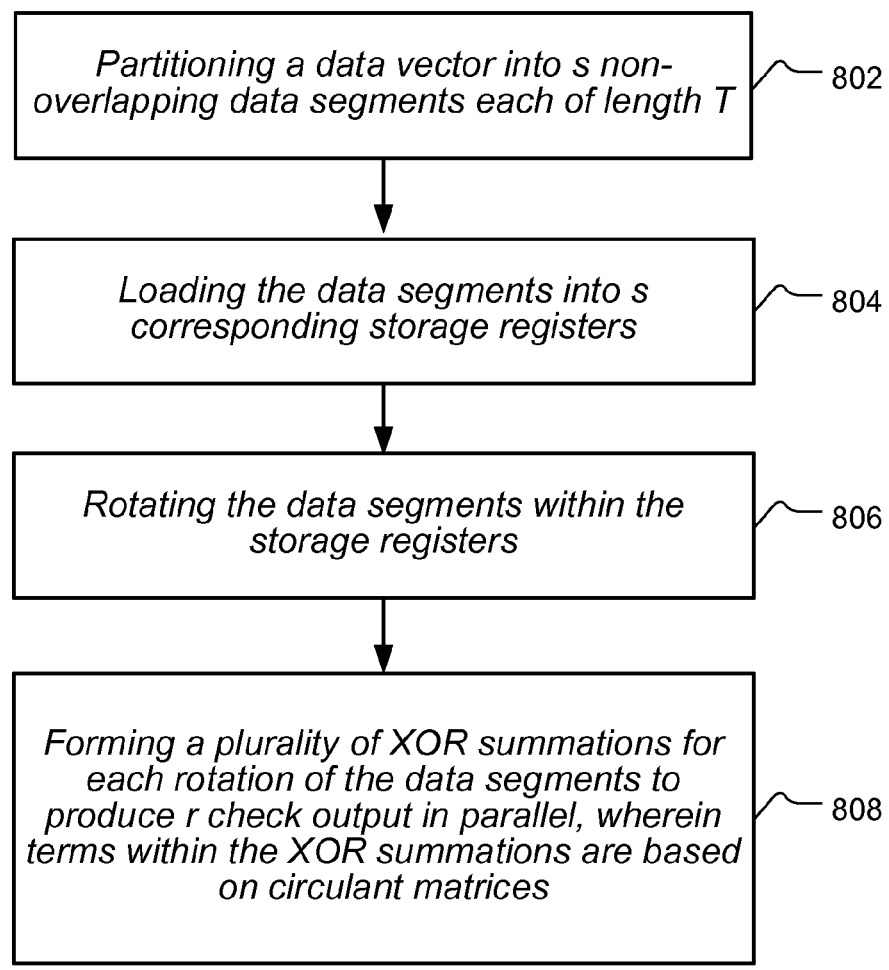
FIG. 9 is a flow chart of a method for encoding a LDPC code in accordance with an embodiment of the present invention.

A method of encoding a data vector to produce output symbols for a low-density parity check code will now be described in conjunction with the flow chart of FIG. 9. The low-density parity check code may have a block circulant matrix of size rT×sT, for example, as described generally above, wherein r, s and T are all integers. The method 800 can include partitioning 802 the data vector into s non-overlapping data segments. Each data segment has a length of T. The method can include loading 804 the data segments into s corresponding storage registers. For example, partitioning may be based on predefined connections from an input buffer to a shift register or memory. As another example, partitioning may be based on timing, where serial format data is shifted into shift registers, and the final load position is a function of data order and clock count.

The method 800 can include rotating 806 the data segments within the storage registers. For example, the storage registers may provide a circular rotation capability. As another example, a serial load input to the storage register may be multiplexed between data input and circular shifting.

The method 800 can also include forming 808 a plurality of XOR summations for each rotation of the data segments. The summations can produce r output symbols in parallel. Terms within the XOR summations are based on the first rows of circulant matrices. In other words, connections of the XOR summations to the shift registers correspond to the circulant matrices. For the case where the block circulant matrix is a generator matrix, the method may include outputting the output symbols as parity symbols.

As described above, the block circulant matrix may be a generator matrix or a sub-matrix portion of a generator matrix. As another example, the block circulant matrix may be a sub-matrix portion of a parity check matrix. When the block circulant matrix is a sub-matrix portion of a parity check matrix, the method may also include recursively summing the plurality of output symbols or some other additional processing to form a plurality of parity symbols. For example, each parity symbol may be based the XOR summation of one or more previous parity symbols plus an output symbol. The parity symbols may be output, as describe above.

As noted above, output symbols or parity symbols are produced by the method. For example, output symbols or parity symbols may be output to a memory and stored for later use (e.g., in additional processing). As another example, the output symbols or parity symbols may be output as an electrical signal for use by a transmitter within a communication system, as described above. The source data may also be output as an electrical signal for use by a transmitter.

Summarizing and reiterating to some extent, it will be appreciated that several advantages are provided by the presently disclosed inventive techniques. The foregoing examples are necessarily limited in complexity in the interest of brevity. Alternate arrangements of a LDPC encoder similar to the above examples will occur to one of skill in the art. Benefits of the disclosed encoder include fast operation, as multiple output symbols can be computed in parallel. For example, r-fold speedup of encoding rate can be obtained as compared to a purely serial implementation. Moreover, the encoding architecture is amenable to operation within an FPGA or ASIC. Shift registers are easily implemented using memory blocks or serially connected flip flops or latches. Exclusive-or functions can be implemented using lookup tables or logic gates. Few interconnections between the shift registers and exclusive-or gates are used based on the sparse nature of the LDPC parity check matrix helping to simplify routing within the encoder. The interconnections can be hard-wired further simplifying the encoder.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

What is claimed is:

1. An encoder for encoding a data vector for a low-density parity check code having a block circulant encoding matrix of size rT by sT built from circulant matrices of size T by T, comprising:
    a) s shift registers, each of the shift registers having a load input to receive a non-overlapping data segment of length T of the data vector, and having a feedback connection to enable rotation of the data segment within the shift register; and
    b) r XOR gates coupled to shift registers, the XOR gates having connections to the shift registers corresponding to the circulant matrices to produce r output symbols in parallel for each rotation of the data.

2. The encoder of claim 1, wherein the block circulant encoding matrix is a sub-matrix of a systematic generator matrix.

3. The encoder of claim 1, wherein the block circulant encoding matrix is a generator matrix.

4. The encoder of claim 1, wherein the block circulant encoding matrix is a sub-matrix of a parity check matrix.

5. The encoder of claim 4, further comprising:
    c) a plurality of XOR summers coupled to the XOR gates to accept the output symbols and form a plurality of recursively-calculated parity symbols.

6. The encoder of claim 1, wherein the encoder is implemented in a field programmable gate array.

7. The encoder of claim 6, wherein the connections between the shift registers and XOR gates are implemented by fixed logic equations.

8. The encoder of claim 1, wherein the encoder is implemented in an application specific integrated circuit.

9. The encoder of claim 8, wherein the connections between the shift registers and XOR gates are fixed interconnect traces.

10. The encoder of claim 1, wherein the encoder is implemented in a computer processor.

11. A communication system using the encoder of claim 1.

12. An encoder for a low-density parity check code having a block circulant encoding matrix of size rT by sT built from circulant matrices of size T by T, comprising:
    a) means for storing a data input as s non-overlapping data segments each of length T;
    b) means for rotating each of the data segments; and
    c) means for forming a plurality of XOR summations for each rotation of the data segments to produce r output symbols in parallel, wherein the XOR summations use data selections from the data segments corresponding to the circulant matrices.

13. The encoder of claim 12, further comprising:
    d) means for recursively summing the plurality of output symbols to form a plurality of parity symbols.

14. A method of encoding a data vector to produce output symbols for a low-density parity check code having a block circulant encoding matrix of size rT by sT built from circulant matrices of size T by T, the method comprising
    a) partitioning the data vector into r non-overlapping data segments each of length T;
    b) loading the data segments into r corresponding storage registers;
    c) rotating the data segments within the storage registers; and
    d) forming a plurality of XOR summations for each rotation of the data segments to produce s output symbols in parallel, wherein terms within the XOR summations are based on the circulant matrices.

15. The method of claim 14, wherein the block circulant encoding matrix is any one of a generator matrix, a sub-matrix of a systematic generator matrix, and a sub-matrix of a parity check matrix.

16. The method of claim 15, further comprising:
    e) recursively summing the plurality of output symbols to form a plurality of parity symbols.

17. The method of claim 16, further comprising outputting the parity symbols.

18. The method of claim 14, further comprising outputting the output symbols.

* * * * *